US006479871B2

(12) United States Patent
Peters et al.

(10) Patent No.: US 6,479,871 B2
(45) Date of Patent: Nov. 12, 2002

(54) ELECTROSTATIC DISCHARGE (ESD) LATCH-UP PROTECTIVE CIRCUIT FOR AN INTEGRATED CIRCUIT

(75) Inventors: Christian Peters, München (DE); Dirk Uffmann, München (DE); Hans-Heinrich Viehmann, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/833,353

(22) Filed: Apr. 12, 2001

(65) Prior Publication Data

US 2001/0048137 A1 Dec. 6, 2001

(30) Foreign Application Priority Data

Apr. 12, 2000 (EP) .......................................... 00107880

(51) Int. Cl.$^{7}$ ................................................ H01L 23/62
(52) U.S. Cl. ........................................ 257/355; 257/288
(58) Field of Search ................................ 257/355, 356, 257/357, 362, 360, 361, 565, 375, 378

(56) References Cited

U.S. PATENT DOCUMENTS 4,967,256 A * 10/1990 Pathak et al.
5,237,395 A * 8/1993 Lee
5,485,024 A 1/1996 Reay
5,880,488 A 3/1999 Yu
5,894,153 A * 4/1999 Walker et al.
5,923,067 A * 7/1999 Voldman
5,959,821 A 9/1999 Voogel
6,061,218 A * 5/2000 Ida et al.

FOREIGN PATENT DOCUMENTS

| | | |
|---|---|---|
| EP | 0 535 536 A1 | 4/1993 |
| EP | 0 703 622 A2 | 3/1996 |
| GB | 2 283 857 A | 5/1995 |

OTHER PUBLICATIONS

Amerasekera, A. et al.: "ESD in silicon integrated circuits", Design and Measurement in Electronic Engineering, John Wiley & Sons Ltd., ISBN 0471954810, pp. 72–83.

* cited by examiner

*Primary Examiner*—Nathan J. Flynn
*Assistant Examiner*—Kevin Quinto
(74) *Attorney, Agent, or Firm*—Laurence A. Greenberg; Werner H. Stemer; Ralph E. Locher

(57) ABSTRACT

The ESD protective circuit proceeds from a modified lateral pnpn "latch-up" protective structure having a highly doped n-type zone, which is arranged on the well boundary, along that section of the periphery of the well which runs between the two oppositely doped regions. The highly doped zone is formed of pads arranged with intermediate spacing along the section of the periphery of the well. The result is a low triggering voltage in conjunction with a low on resistance.

6 Claims, 2 Drawing Sheets

Vcc
Vss
n-well
n+
p+
n+
p+
Vss
n+
8
1
12
10
5
16
14
13
15
3
2
4
9
7
11

16
Vss
13
15
Vcc
Vss
n+
n+
p+
n+
p+
n+
n+
14
5
8
10
3
4
n-well
9
2
12
8
11
p
p+
Vss
1

Prior Art

ELECTROSTATIC DISCHARGE (ESD) LATCH-UP PROTECTIVE CIRCUIT FOR AN INTEGRATED CIRCUIT

BACKGROUND OF THE INVENTION

Field of the Invention

The invention lies in the integrated technology field and relates, more specifically, to an ESD protective circuit for an integrated circuit, which is integrated in a semiconductor substrate of the integrated circuit, having a lateral pnpn "latch-up" protective structure formed by a first region, which is doped with a first doping type, is arranged in a well doped oppositely, with a second doping type, and is provided with a first connection electrode, the well being inserted into the semiconductor substrate doped with the first doping type, and also by a second region, which is doped with the second doping type, is arranged outside the well in the semiconductor substrate and is provided with a second connection electrode, and having a highly doped zone of the second doping type, which is arranged on the well boundary, at the same time partly overlapping the well, along that section of the periphery of the well which runs between the two regions.

An ESD protective circuit of that type is disclosed in the reference book by Amerasekera and Duvvury, "ESD in Silicon Integrated Circuits", John Wiley and Sons, Chichester (1995).

Integrated circuits, primarily the sensitive circuits using complementary MOS technology (CMOS), are often intended to be protected against damage which can be caused by an electrostatic discharge (ESD). An ESD event can result in a voltage breakdown through a dielectric that isolates two surfaces, that is to say ultimately a short circuit, which may lead to damage for example in oxide layers or on interconnects or connections of the integrated circuit. The electrostatic charging of the circuit that precedes this sudden discharge is usually brought about through contact between the circuit and an electrically charged human body or a charged machine.

In order to afford protection against such ESD events, it is customary to integrate protective circuits on the semiconductor substrate of the circuit to be protected, which, when a hazardous discharge current and/or a discharge voltage occurs, are activated, assume a low-impedance state and draw off the discharge current at least to an extent such that the sensitive regions of the circuit to be protected remain safe. So far, circuits having lateral pnpn "latch-up" structures have proved to be the most effective ESD protection.

The "latch-up" effect, which has been known per se for a fairly long time, was originally perceived only as an undesirable error source in CMOS circuits. Almost all CMOS circuits have a lateral and a vertical parasitic bipolar transistor which together form a four-layer diode pnpn, comparable to a thyristor. The four-layer structure can be triggered in the event of interference of the applied supply voltage. This transition from the normal state of the pnpn structure to a highly conductive state is referred to as "latch-up". The integrated circuit can be thermally overloaded by the current path formed in an undesired manner between the transistor connections in this context.

A structure which is similar but is produced in a desired manner and in addition to the actual integrated circuit and is based on elements arranged laterally in the substrate is currently used, as already mentioned, as ESD protection and is described in detail in sections 4.2.4 to 4.3.1 of the aforementioned reference book. This known latch-up protective structure (Lateral Silicon Controlled Rectifier, LSCR) or its modified embodiment (MLSCR) that is also described therein will now be explained, in order to provide a better understanding of the invention, in connection with FIG. 3 (cf. FIGS. 4.35 and 4.31 in Amerasekera and Duvvury, supra).

FIG. 3A shows a schematic cross-sectional view of a prior art MLSCR ESD protective structure. There, an n-conducting well 2 is inserted into a weekly p-doped substrate 1. A highly p-doped region 3 and, in order to connect the n-type well 2 to the supply voltage, a highly n-doped region 4 are produced in the n-type well 2. A further highly n-doped region 5, which is connected to ground, is produced outside the n-type well 2. This configuration already produces a lateral pnpn structure:

Region 3, n-type well 2, p-type substrate 1, region 5, which forms the basic LSCR protective structure. What is crucial for the triggering voltage of the pnpn protective structure is the pn junction between the p-type substrate 1 and the n-type well 2. A triggering voltage of about 50 V or less results for contemporary typical CMOS process parameters.

With the ever greater miniaturization of the structures on the semiconductor chips and the associated danger caused even by smaller voltages, there is a need for ESD protective circuits which react even to low voltages, for example below 50 V. In order to reduce the triggering voltage, the cited literature therefore proposes additionally arranging the highly n-doped zone 6—illustrated in FIG. 3A—above the well boundary between the n-type well 2 and the p-type substrate 1. By virtue of this measure, the triggering voltage of the thus modified LSCR structure (MLSCR) in typical 0.8 μm CMOS processes is virtually halved and the parasitic capacitance is increased. The highly doped n-type zone 6 proposed is embodied as strips on the well boundary.

FIG. 3B shows the layout of the circuit of FIG. 3A in a schematic view from above. The regions 3 and 4 situated within the n-type well 2, and the region 5 situated laterally outside the n-type well 2 are shown. The strip-shaped highly doped n-type zone 6 on that section of the periphery 7 of the n-type well 2 which runs between the regions 3 and 5 is intended to have the effect that the lateral latch-up structure used as protective structure triggers both statically and dynamically in the case of an ESD event at a lower voltage than previously, and thus also sooner than other, unintentional parasitic latch-up structures within the integrated circuit, in order thus to avoid a failure of the circuit due to interconnects melting, increased leakage currents, and the like.

Although the use of the MLSCR achieves the lowering of the triggering voltage that is sought, it is also known from the cited literature and it has been confirmed in practical tests that the lowering of the triggering voltage with the aid of the n-type zone 6 is accompanied by the disadvantage of a higher on resistance of the pnpn protective structure after triggering. The consequence of this, for example for a chip which, with the LSCR, exhibited failures above 2 kV (ESD test according to the human body model), is that failures occur at as little as 1.5 kV when the MLSCR is used. In accordance with the cited literature, the increased on resistance is brought about precisely by the n-type diffusion strip 6 which is used to lower the triggering voltage and lies directly in the low-impedance (after triggering) path of the pnpn structure.

SUMMARY OF THE INVENTION

The object of the present invention is to provide an ESD protective circuit which overcomes the above-noted deficiencies and disadvantages of the prior art devices and methods of this general kind, and which results in a low triggering voltage, but without an increased on resistance.

With the above and other objects in view there is provided, in accordance with the invention, an ESD protective circuit for an integrated circuit in a semiconductor substrate having a doping of a first doping type, comprising:

a lateral pnpn "latch-up" protective structure formed by a first region with a doping of a first doping type arranged in a well formed in the semiconductor substrate and having a doping of a second doping type opposite the first doping type, and formed with a first connection electrode;

a second region with a doping of the second doping type arranged outside the well in the semiconductor substrate, and formed with a second connection electrode; and a highly doped zone formed of a plurality of mutually spaced-apart pads with a doping of the second doping type, the pads being disposed to partly overlap the well and to cover a well boundary along a section of a well periphery running between the first region and the second region.

In other words, the objects of the invention are satisfied in the case of an ESD protective circuit of the type mentioned in the introduction by virtue of the fact that the highly doped zone is designed in the form of pads arranged with intermediate spacing along the section of the periphery of the well.

The effect achieved by the ESD protective circuit according to the invention with its optimizable layout is that the triggering voltage decreases, as in the case of the known MLSCR, and a low on resistance occurs at the same time, said on resistance virtually corresponding to the value in the case of the LSCR. To that end, in contrast to the known MLSCR, a continuous highly doped strip zone is not implanted above the well boundary, but rather merely a plurality of highly doped pads with intermediate spacings. In gap regions between the implanted pads, the current path after triggering is at low impedance, as in the case of the LSCR, while the function of lowering the triggering voltage is fulfilled to a sufficient extent by the highly doped pads arranged between anode and cathode of the pnpn structure, along the pn junction of n-type well/p-type substrate. The two desired effects are thus achieved simultaneously in one and the same section of the periphery of the well. This opens up opportunities for skillful configuration of the layout, in particular with regard to minimization of the area taken up by the ESD protective circuit within the integrated circuit.

In accordance with the present invention, it is unimportant here whether the first doping type is p-type doping and the second doping type is n-type doping, or vice versa.

In accordance with an added feature of the invention, the "latch-up" protective structure is constructed mirror-symmetrically from two lateral bipolar transistors formed by two laterally adjacent regions doped with the first doping type and a central region doped with the second doping type and disposed between the two laterally adjacent regions, the two laterally adjacent regions and the central region being disposed within the well and each being connected to a first pole of a supply voltage via a connection electrode; and by two regions doped with the second doping type and respectively disposed laterally adjacent the two laterally adjacent regions outside the well in the semiconductor substrate; and the highly doped pads are disposed with an intermediate spacing along two laterally mirror-symmetrically opposite sections of the periphery of the well.

In other words, this advantageous refinement of the ESD protective circuit with a particularly skillful layout has the "latch-up" protective structure constructed mirror-symmetrically from two lateral bipolar transistors formed by two regions, which are arranged laterally next to one another and are doped with the first doping type and between which is arranged a central region doped with the second doping type, all three regions being arranged within the well and each being connected to a first pole of a supply voltage by means of a connection electrode, and by two regions, which are doped with the second doping type and are arranged laterally, that is to say in each case next to the regions, and outside the well in the semiconductor substrate. The highly doped pads are arranged along the two laterally mirror-symmetrically opposite sections of the periphery of the well.

In accordance with an additional feature of the invention, the pads are arranged along the sections of the periphery of the well with regular intermediate spacings short enough for uniform triggering of the "latch-up" protective structure over an entire length of the sections.

In accordance with another feature of the invention, the first doping type is p-type doping. In the alternative, the first doping type is n-type doping.

With the above and other objects in view there is also provided, in accordance with the invention, an integrated circuit with the above-outlined ESD protective circuit. The integrated circuit has input/output and ground connections and the ESD protective circuit is connected between the input/output connection and ground connection of the integrated circuit in such a way that, in the event of a sufficiently intense electrostatic discharge at the input/output connection, the ESD protective circuit triggers, assumes a low-impedance state, and thereby draws off or absorbs a discharge current of the electrostatic discharge. Other features which are considered as characteristic for the invention are set forth in the appended claims.

Although the invention is illustrated and described herein as embodied in an ESD latch-up protective circuit for an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
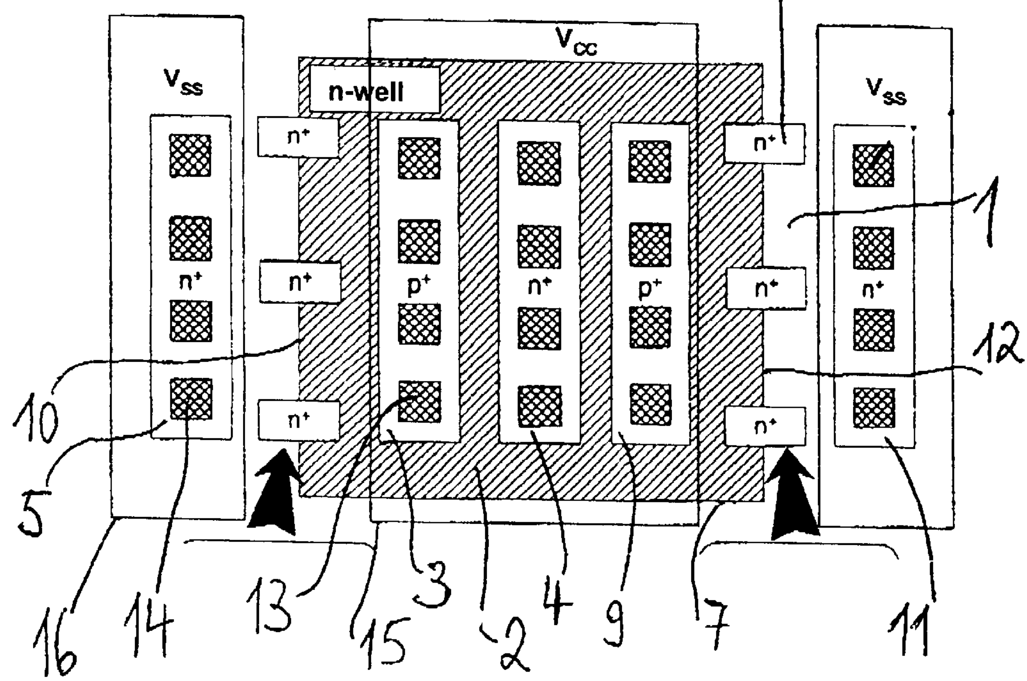
FIG. 1 is a diagrammatic plan view of the layout of the protective circuit according to the invention.
Figure 2:
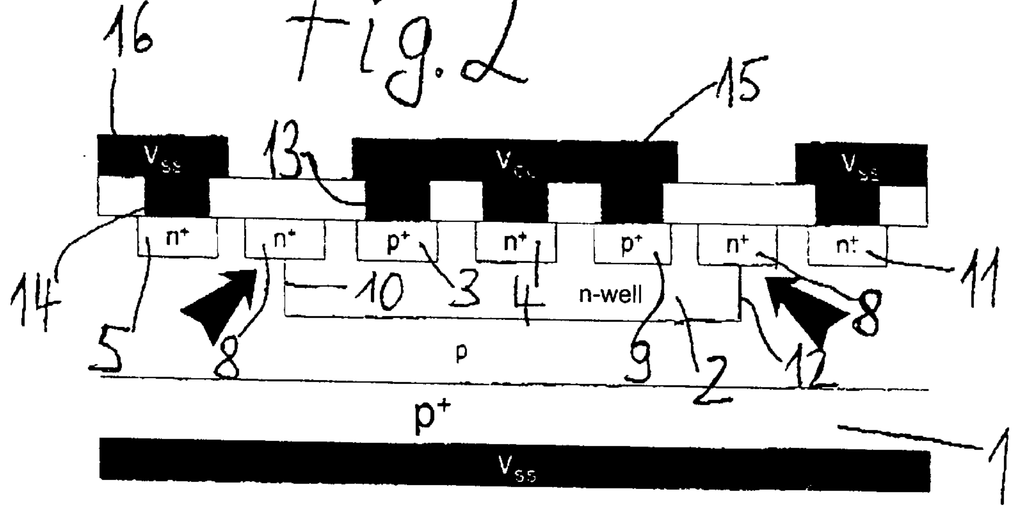
FIG. 2 is a vertical sectional view of the protective circuit according to the invention illustrated in FIG. 1.
Figure 3A:
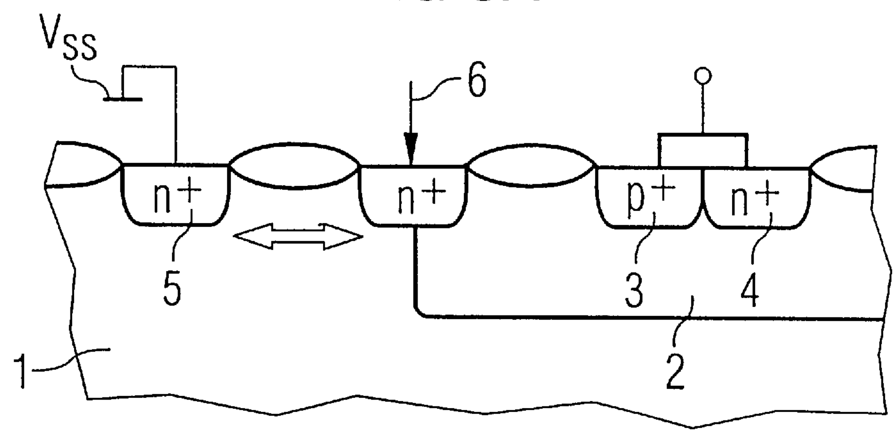
FIG. 3A is a diagrammatic vertical section, similar to the illustration in FIG. 2, of a prior art protective circuit.
Figure 3B:
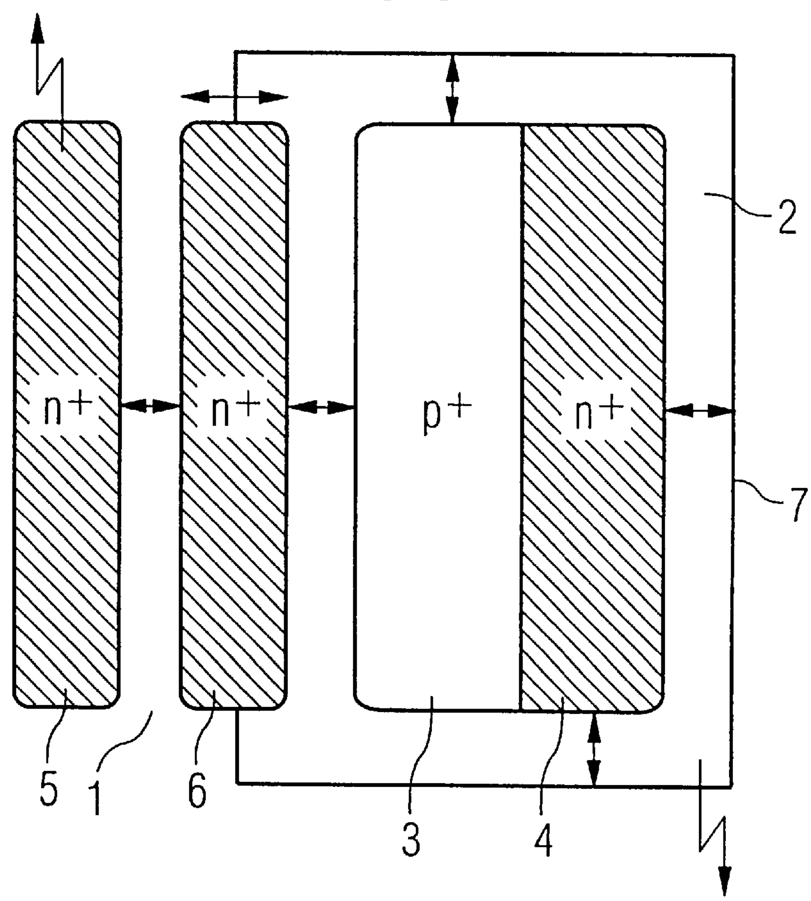
FIG. 3B is a diagrammatic plan view of the prior art protective circuit of FIG. 3A.

Referring now to the figures of the drawing in detail and first, particularly, to FIG. 1 thereof, there is seen a laterally mirror-symmetrical layout of a protective circuit according to the invention. An n-type well 2 is inserted in the weakly p-doped substrate 1, a central strip-shaped n-type region 4 and, to the left and right thereof, a respective highly doped p-type region 3 and 9 being produced in said well. A respective highly doped n-type region 5 and 11 is illustrated on the left and on the right outside the n-type well 2. Also illustrated by way of example in FIG. 1 are the respective connection electrodes 13 and 14 of the individual regions. The electrodes each lead to a common or individual metallization layer 15 and 16. As can be better discerned from FIG. 2, the semiconductor substrate 1, which is usually connected via a rear-side contact, and the individual regions 5, 3, 4, 9 and 11 are connected to ground $V_{ss}$ and the supply voltage $V_{cc}$. The highly n-doped pads 8 are not connected, but rather are floating. The well 2 is connected via the central highly n-doped region 4 arranged in the middle of the lateral structure. The well 2 can be produced by the customary means of process technology (implantation, diffusion, etc.) as a substrate region of the second conductivity type in the doped semiconductor substrate 1 of the first conductivity type. The doping of the heavily doped regions or zones of the protective circuit lies in a range of typically $10^{20}/cm^3$, depending on the predetermined process technology.

As illustrated in FIG. 1, a section 10 of the periphery 7 of the n-type well 2 runs between the regions 5 and 3 and a laterally mirror-symmetrically opposite section 12 runs between the regions 9 and 11. The sections 10 and 12 thus form the left and right narrow sides, respectively, of the rectangular periphery 7. In each case three highly doped n-type pads 8 placed with regular intermediate spacing are arranged on the well boundary of the sections 10 and 12. The size of said pads can advantageously be limited to the predetermined minimum that is possible in terms of the process technology, for example 1×1 or 2×2 $\mu$m. In order to ensure the homogeneous triggering of the two adjacent pnpn structures over the entire length of the respective narrow side, the pads 8 should not be too far apart from one another. Therefore, given a length of the narrow side of approximately 100 $\mu$m, about ten regularly spaced pads 8 might be necessary.

In the ESD situation, voltage pulses at the input/output of the integrated circuit lead to a dynamic triggering process in the protective circuit, which thereupon assumes a low-impedance state and thereby draws off or absorbs the discharge current. The low-impedance current path between the highly n-doped pads 8 prevents the existence of an excessively high residual voltage—constituting a potential hazard to the protective circuit—in the triggered state. The rectangular periphery 7 of the well 2 is preferably connected only at the narrow sides, as illustrated in FIG. 1, in order to avoid a current path diagonally across, which might be accompanied by a higher current density and a correspondingly dangerous dissipated power density. Compared with a single-sided arrangement, the laterally mirror-symmetrical layout shown in FIG. 1 advantageously leads to a doubled power loss which can be handled in the ESD situation. In the case of a single-sided arrangement, on the other hand, a doubling of the length of the section 10 or 12 would necessarily be accompanied by an untenably high area occupation of the ESD circuit within the integrated circuit.

The general advantage of the invention consists in an improvement of the ESD protection of integrated circuits, e.g. smart card ICs, and also the avoidance of failures when using circuit modules with an unfavorable layout or latch-up. A reuse concept can then continue to be used for such modules. Previously, redesign cycles were necessary in order to achieve qualification in accordance with ESD specifications. This means a cost- and time-saving potential.

We claim:

1. An ESD protective circuit for an integrated circuit in a semiconductor substrate having a doping of a first doping type, comprising:

a "latch-up" protective structure constructed mirror-symmetrically from two lateral bipolar transistors formed by two laterally adjacent regions doped with the first doping type and a central region doped with a second doping type and disposed between said two laterally adjacent regions;

said two laterally adjacent regions and said central region being disposed within a well and each being connected to a first pole of a supply voltage via a connection electrode;

by two regions doped with the second doping type and respectively disposed laterally adjacent said two laterally adjacent regions outside the well in the semiconductor substrate; and a highly doped zone formed of a plurality of mutually spaced-apart pads with a doping of the second doping type, said pads being disposed to partly overlap said well and to cover a well boundary along a section of a well periphery running between a first region and a second region;

said highly doped pads being disposed with an intermediate spacing along two laterally mirror-symmetrically opposite sections of the periphery of the well.

2. The ESD protective circuit according to claim 1, wherein said pads are arranged along the sections of the periphery of the well with regular intermediate spacings short enough for uniform triggering of the "latch-up" protective structure over an entire length of the sections.

3. The ESD protective circuit according to claim 1, wherein the first doping type is p-type doping.

4. The ESD protective circuit according to claim 1, wherein the first doping type is n-type doping.

5. In combination with an integrated circuit having an input/output connection and a ground connection, the ESD protective circuit according to claim 1 connected between the input/output connection and ground connection of the integrated circuit, said ESD protective circuit being configured and connected in such a way that, in the event of a sufficiently intense electrostatic discharge at the input/output connection, said ESD protective circuit triggers, assumes a low-impedance state, and thereby draws off or absorbs a discharge current of the electrostatic discharge.

6. The ESD protective circuit according to claim 2, wherein the first doping type is n-type doping.

* * * * *